United States Patent [19]
Kimura et al.

[11] Patent Number: 5,389,851
[45] Date of Patent: Feb. 14, 1995

[54] LAMINATED PIEZOELECTRIC ELEMENT

[75] Inventors: Daisuke Kimura, Kawasaki; Yuji Oshime, Fuchu, both of Japan

[73] Assignee: Fujitsu Limited, Kawasaki, Japan

[21] Appl. No.: 108,938

[22] Filed: Aug. 19, 1993

Related U.S. Application Data

[63] Continuation of Ser. No. 735,038, Jul. 24, 1991, abandoned.

[30] Foreign Application Priority Data

Jul. 30, 1990 [JP] Japan ................. 2-199299

[51] Int. Cl.6 .................................... H01L 41/08
[52] U.S. Cl. .................................... 310/340; 310/328
[58] Field of Search ............... 310/323, 328, 340, 358, 310/366

[56] References Cited

U.S. PATENT DOCUMENTS

| | | | |
|---|---|---|---|
| 4,392,907 | 7/1983 | Shirato et al. | 156/252 |
| 4,633,120 | 12/1986 | Sato et al. | 310/328 |
| 4,784,893 | 11/1988 | Nishimoto et al. | 428/209 |
| 4,803,763 | 2/1989 | Eturo et al. | 29/25.35 |
| 4,990,939 | 2/1991 | Sekiya et al. | 346/140 R |
| 5,083,366 | 1/1992 | Arakawa et al. | 29/605 |
| 5,148,077 | 9/1992 | Grawey et al. | 310/328 |
| 5,196,757 | 3/1993 | Omatsu | 310/358 |

FOREIGN PATENT DOCUMENTS

| | | | |
|---|---|---|---|
| 0144655 | 6/1985 | European Pat. Off. | H01L 41/08 |
| 0350941 | 1/1990 | European Pat. Off. | H01L 41/08 |
| 0045290 | 3/1982 | Japan | 310/358 |
| 62-206281 | 9/1986 | Japan | H01L 41/08 |
| 62-219677 | 9/1987 | Japan | H01L 41/22 |
| 62-291080 | 12/1987 | Japan | H01L 41/08 |
| 0105590 | 4/1990 | Japan | 310/358 |
| 0125678 | 5/1990 | Japan | 310/358 |
| 0188974 | 7/1990 | Japan | 310/358 |
| 0007076 | 1/1991 | Japan | 310/358 |
| 0598179 | 2/1948 | United Kingdom | 310/340 |

Primary Examiner—Thomas M. Dougherty
Attorney, Agent, or Firm—Staas & Halsey

[57] ABSTRACT

A laminated piezoelectric element which includes a laminate of piezoelectric ceramic plates and inner electrodes. The piezoelectric ceramic plates are laminated alternately together with the inner electrodes. The laminate is cut so as to have a peripheral surface. A positive outer electrode is connected to one group of inner electrodes at a peripheral surface of the laminate, and a negative outer electrode is connected to another group of inner electrodes at the peripheral surface of the laminate. A coating of fine ceramic particles is applied to, or a ceramic layer is sputtered on, the peripheral surface of the piezoelectric ceramic plates so that the insulation between adjacent inner electrodes is improved.

12 Claims, 3 Drawing Sheets

LAMINATED PIEZOELECTRIC ELEMENT

This application is a continuation of application Ser. No. 07/735,038, filed Jul. 24, 1991, now abandoned.

BACKGROUND OF THE INVENTION

1. Field of the Invention

The present invention relates to a laminated piezoelectric element particularly useful as an actuator.

2. Description of the Related Art

Currently, in answer to the demand for high speed printing, a laminated piezoelectric element capable of very quick response when the voltage applied thereto is changed, is used as an actuator in a printing head. Nevertheless, in laminated piezoelectric elements, insulation breakdowns and current leaks occur due to recesses or pores present on the surface of piezoelectric ceramics, and accordingly, it is difficult to obtain a desired reliability. Therefore, there is a need for a highly reliable laminated piezoelectric element which is resistant to insulation breakdowns.

Conventional laminated piezoelectric elements are manufactured by preparing a plurality of green sheets made of piezoelectric ceramics, coating a metal paste film on one of the surfaces of each green sheet, to thus form an inner electrode, laminating and sintering the plurality of the green sheets, cutting the laminate to a predetermined size, and connecting positive and negative outer electrodes to the inner electrodes, which are exposed at both sides of the cut laminate, so that a voltage can be applied to each of the piezoelectric ceramics sandwiched between the inner electrodes. The thus formed laminated piezoelectric element is often further encapsulated by a resin for insulation purposes.

Nevertheless, piezoelectric ceramics contain many pores in the body thereof, which are formed during the fabrication thereof, and recesses are formed on the surface of the piezoelectric ceramics when such piezoelectric ceramics are cut, and water in the air is captured and adsorbed in such recesses if the laminate is used in a high temperature and high humidity atmosphere. Even if a resin coating is provided around the laminated piezoelectric element, the resin coating may tend to peel from the surface of the piezoelectric ceramics during repeated operation of the piezoelectric element, and thus water can penetrate past the resin coating and reach the surface of the piezoelectric ceramics and, in this case also water is captured and adsorbed in recesses on the surface of the piezoelectric ceramics. If water is present in the recesses on the surface of the piezoelectric ceramics, a current path can be formed through the water layer, whereby the insulation between the inner electrodes is broken and a current occurs, and accordingly, a voltage applied to the piezoelectric ceramic becomes inappropriate for the desired purpose, and thus the reliability of the laminated piezoelectric element is lessened.

SUMMARY OF THE INVENTION

Therefore, an object of the invention is to solve the above problems by preventing the current leakage caused by insulation breakdown between the inner electrodes, and to provide a laminated piezoelectric element which is highly reliable even when used in a high temperature and high humidity atmosphere.

The above object of the invention is attained by providing a laminated piezoelectric element comprising a laminate of piezoelectric ceramic plates and inner electrodes, the piezoelectric ceramic plates being laminated alternately with the inner electrodes, the laminate having a peripheral surface. A positive outer electrode is connected to alternate inner electrodes at the peripheral surface of the laminate, and a negative outer electrode is connected to the other alternate inner electrodes, also at the peripheral surface of the laminate. Fine ceramic particles are coated on the peripheral surfaces of the piezoelectric ceramic plates.

The presence of such ceramic particles in the recesses on the peripheral surfaces of the piezoelectric ceramic plates ensures that, even if water is captured in those recesses, a current path between inner electrodes is not easily formed.

Therefore, the size of the fine ceramic particles should be substantially smaller than the size of the recesses in the piezoelectric ceramic plate. Accordingly, since the size of recesses or pores in a piezoelectric ceramic is usually about 5 to 10 $\mu$m in its largest dimension, the fine ceramic particles preferably have an average particle size of less than about 5 $\mu$m in its largest dimension, more preferably less than 3 to 2 $\mu$m, and most preferably less than 1 $\mu$m. The fine ceramic particles that may be used in the present invention are, for example, BN, TiN, $Al_2O_3$, BeO, $Si_3N_4$ and AlN, etc., but preferably BN and AlN are used.

For example, the fine ceramic particles may be coated by spraying a mixture of fine ceramic particles and a volatile solvent. Alternatively, the fine ceramic particles may be coated on the peripheral surfaces of the piezoelectric ceramic plate, together with a resin as a binder. A preferred amount of a resin is less than 80% by volume, more preferably about 10 to 30% by volume. If the amount of the resin is too high, the proportion of fine ceramic particles present in the recesses on the peripheral surface of the piezoelectric ceramic plate is undesirably lowered. Examples of the resin used as a binder include epoxy, urethane, acryl, vinyl, etc. Further, after fine ceramic particles are first coated on the peripheral surfaces of the piezoelectric ceramic plate, the fine ceramic particle layer may be covered by a resin layer to fix the fine ceramic particles on the peripheral surfaces of the piezoelectric ceramic plate.

Alternatively, a piezoelectric element may be coated with a ceramic layer by sputtering, whereby the recesses on peripheral surfaces of the piezoelectric ceramic plates are filled by the ceramic layer. In this case, the sputtering should be performed at a low temperature to prevent fusing of an insulating glass provided on a peripheral surface of the inner electrodes.

The piezoelectric ceramic plate may be made of any piezoelectric ceramic material, for example, barium titanate, lead titanate, lead zirconate, etc., or a solid solution thereof.

DESCRIPTION OF THE PREFERRED EMBODIMENTS

Figure 1:
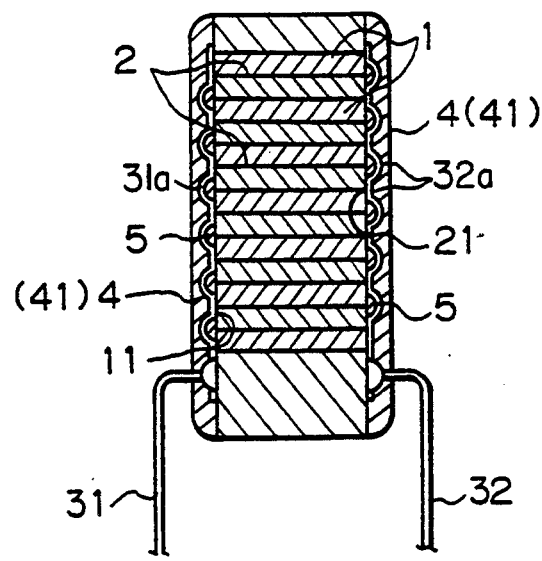
FIG. 1 is a cross-sectional view of a piezoelectric element.
Figure 2:
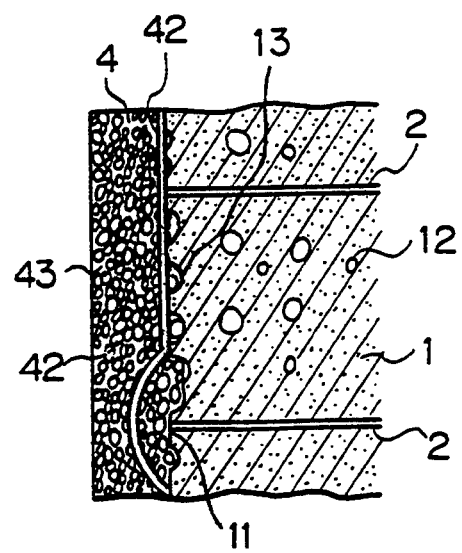
FIG. 2 is an enlarged cross-sectional view of a portion of a piezoelectric element of the present invention, with electrodes 31, 32 and members 31a, 32a omitted for clarity.

Referring to FIG. 1, a laminated piezoelectric element comprises a laminate of piezoelectric ceramic plates 1 and inner electrodes 2 arranged such that each of the inner electrodes 2 is sandwiched between a pair of piezoelectric ceramic plates 1. The thickness of each piezoelectric ceramic plate 1 is about 110 μm and the number of the piezoelectric ceramic plates 1 is about 140, and thus the stroke of the laminated piezoelectric element becomes about 15 μm and it can be used as an actuator for a printer head, etc. An example of a printer head will be illustrated later with reference to FIGS. 4 and 5.

A commercially obtained laminate of piezoelectric ceramic plates and inner electrodes, is cut to a predetermined shape to form a laminated piezoelectric element, and the cut laminate has respective peripheral surfaces 11, at opposite sides thereof, on which the peripheral surfaces 22 of the inner electrodes 2 and peripheral surface of the piezoelectric ceramic plates 1 are exposed. The piezoelectric ceramic plates 1, made of a solid solution of $Pb(Ni,Nb)O_3$, $PbTiO_3$ and $Pb_{1-z}Zr_zO_3$, for example, have recesses on the peripheral surfaces 22 thereof and the sizes of the recesses typically range from about 5 μm to 10 μm. Electrodes 31 and 32, one of which is positive and the other of which is negative, are each connected, via members 31a and 32a, respectively, to alternative inner electrodes 2 at respective opposite exposed peripheral surfaces 11 of the laminate. The other exposed ends of each of the inner electrodes 2 are insulated by covering the same with glass 5. The inner electrodes 2 are connected to the positive and negative electrodes 31 and 32, respectively.

The peripheral surfaces 11 of the laminated piezoelectric element are coated with a layer 4 of fine ceramic particles, and thus the recesses 13 in the surfaces 11 of the piezoelectric ceramic plates 1, which are derived from the fine pores 12 formed during the fabrication of the plates 1, are filled with fine ceramic particles.

The layer 4 of fine ceramic particles 42 may comprise a mixture of fine ceramic particles, e.g., boron nitride powders, with a resin, e.g., epoxy, as a binder. Such fine ceramic particles 4 having a particle size smaller than that of the recesses 13 (5 to 10 μm) on the surfaces 22 of the piezoelectric ceramic plates 1 will fill the recesses 13, and thus the insulation between adjacent inner electrodes is improved, and as a result, breakdowns between adjacent inner electrodes due to water accumulated in the recesses in a high temperature and high humidity atmosphere are prevented. Also, since ceramic particles such as boron nitride have a high thermal conduction coefficient, heating of the piezoelectric ceramic plates 1, and therefore deterioration of the insulation due to the higher temperature, is prevented.

The ceramic particle layer 41 may be formed, for example, by immersing a laminate of the piezoelectric element in a mixture of fine ceramic particles 42 with a fused resin 43, or by spraying a mixture of fine ceramic particles 42 dispersed in a volatile solvent onto a laminate.

As an example, boron nitride powders 42 having the following distribution of particle sizes were coated on a piezoelectric element.

| particle size (μm): | 3 | 2 | 1.5 | 1 | 0.5 | other |
|---|---|---|---|---|---|---|
| ratio (wt %): | 15 | 33 | 27 | 11 | 9 | 5 |

As a comparative example, a piezoelectric element identical to the above was coated with an epoxy resin not containing a ceramic powder.

Figure 3A:
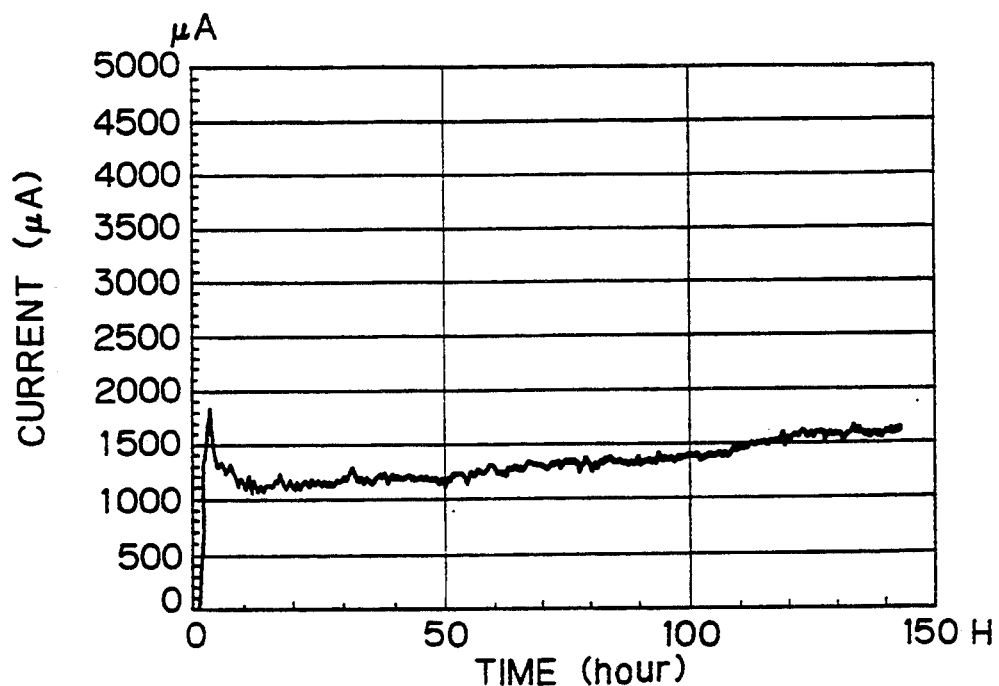
FIG. 3A is a diagram illustrating the leak current of a piezoelectric element of the present invention relative to the application of a voltage to the element.
Figure 3B:
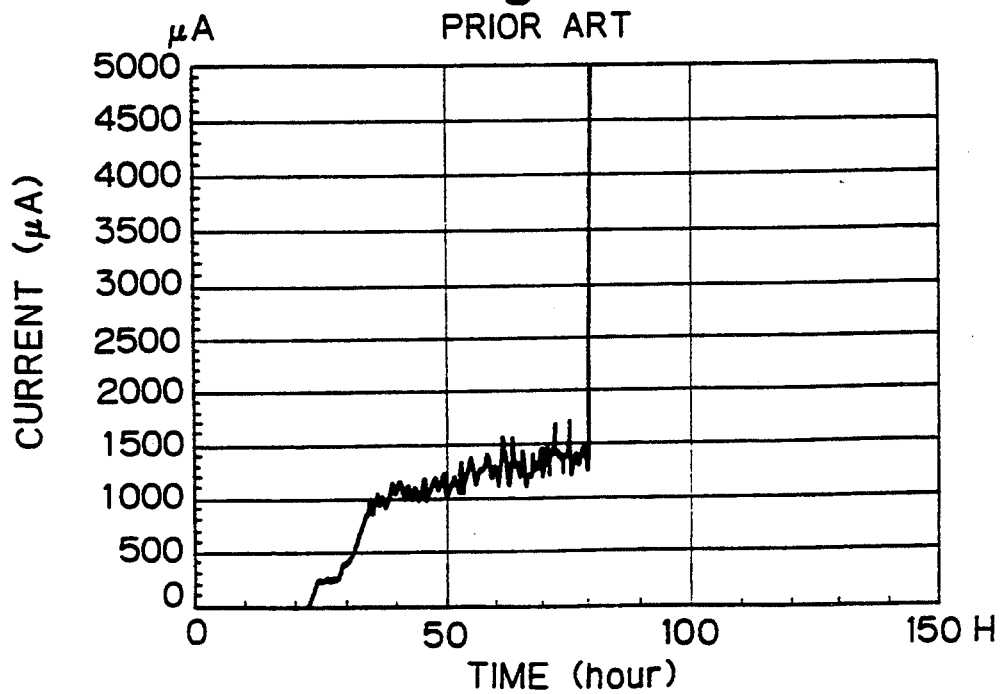
FIG. 3B is a diagram illustrating the leak current of a conventional piezoelectric element relative to the application of a voltage to the element.

A voltage of 120 V was continuously applied to the above conventional piezoelectric element and an element of the present invention, in an atmosphere having a temperature of 40° C. and a humidity of 90% and the leak current was measured in relation to time elapsed. The leak current was measured by passing a current between the positive and negative outer electrodes. The results are shown in FIGS. 3A and 3B. FIG. 3A shows the results of the present invention and FIG. 3B shows that of the conventional element. It is seen in FIGS. 3A and 3B that the conventional piezoelectric element broke down after about 80 hours but that the piezoelectric element of the present invention had not broken down after more than 150 hours.

Figure 4:
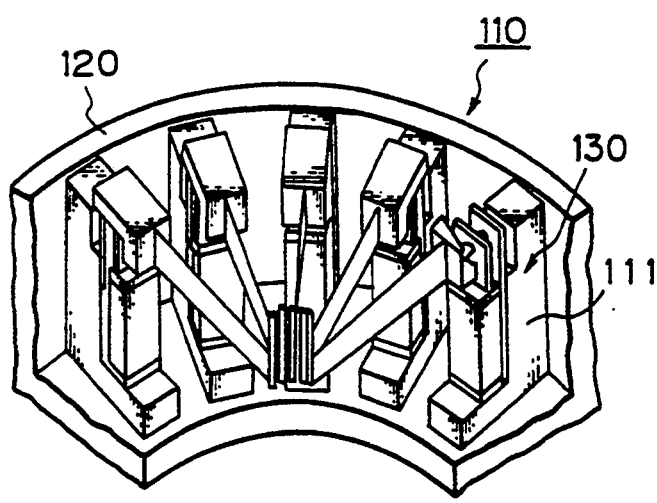
FIG. 4 is a partial perspective view of a printing head, particularly of an actuator for driving dot-impact wires or rods of a printer.
Figure 5:
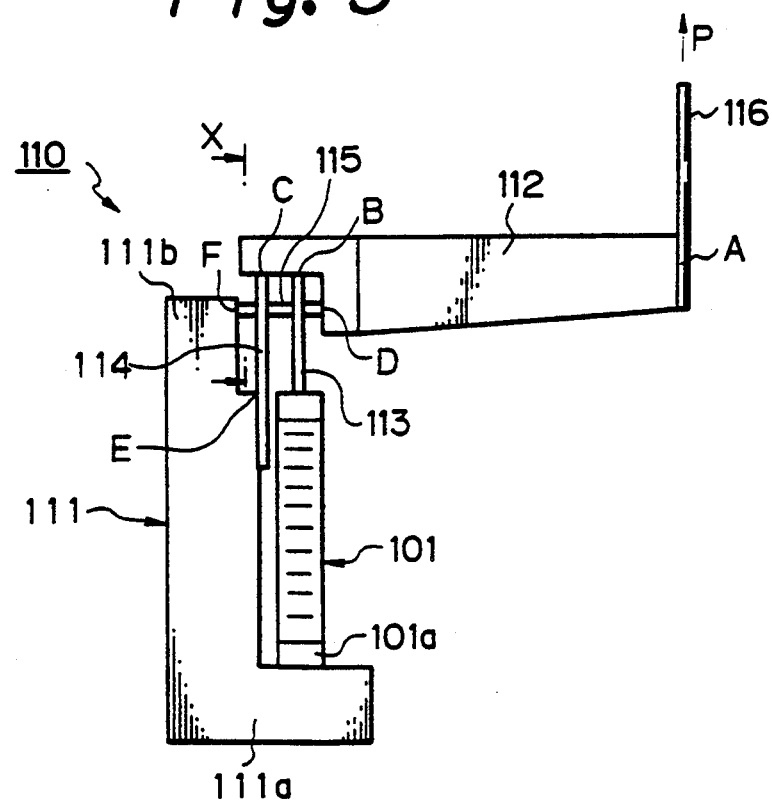
FIG. 5 is a front view of an actuator for driving a dot-impact wire or rod.

FIGS. 4 and 5 illustrate a printing head of a dot-impact printer in which a plurality of actuators comprising a piezoelectric element are used, wherein the printing head 110 comprises a cylindrical housing 120 and a plurality of actuators 130 arranged in the cylindrical housing 120.

Each of the actuators 130 comprises an electro-distortion device 101, an impact printing wire 116, a frame 111, a movable member (or armature) 112, a first resilient member 113, a second resilient member 114, and a resilient connecting (or third resilient) member 115.

The frame 111 is substantially L-shaped, having a base 111a and a side wall 111b extending substantially perpendicular to the base 111a. The electro-distortion device 101, such as a piezoelectric element, has a base portion 101a mounted on the frame base 111a, and therefore, the top free end 101b of the electro-distortion device 101 is displaced upward when an electric power is supplied to the electro-distortion device 101.

The impact printing wire 116 is fixed to an end of the movable member 112 at a position A thereof. A plurality of such printing wires 116 driven by the respective actuators 130 constitute a wire-dot matrix.

The lower end of first resilient member 113 is fixedly connected to the top end 101b of the electrodistortion device 101 and extends upwardly in the same direction as the displacement of the elector-distortion device 101. The upper end of first resilient member 113 is also fixedly connected to the movable member 112 at a position B thereof.

The second resilient member 114 is arranged in parallel to the first resilient member 113 and the lower end thereof is fixedly connected to the side wall 111b of the frame 111 at a position E. The upper end of this second resilient member 114 is fixedly connected to the movable member 112 at a position C thereof.

The distance from the first position A to the second position B is much larger than the distance from the second position B to the third position C, so that the displacement of the electro-distortion device 101 is enlarged by the movable member 112 and transmitted to the impact printing wire 116.

A resilient connecting member 115 made of a metal wire having a circular cross-section extends substantially perpendicularly to the first and second resilient members 113 and 114, which also comprise metal strips. Members 113 and 114 are arranged in parallel relationship relative to each other. The connecting wire 115 is fixedly connected to the movable member 112 at a position D thereof and the other end of wire 115 is fixedly connected to the side wall 111b of the frame 111 at a position F thereof. Wire 115 passes through respective openings in the resilient members 113 and 114. Position D is located nearer the frame base 111a than the plane in which the positions B and C lie. Also, the position F is located on the opposite side of second resilient member 114 from position D.

The operation of the printing head is as follows. For printing electric power is supplied via a drive circuit (not shown) to the electro-distortion device 101, for a predetermined time. In this case, the upper portion 101b of the electro-distortion device 101 is displaced upwardly, and therefore, the movable member 112 is turned in the counterclockwise direction in FIG. 5. Accordingly, the displacement of the electro-distortion device 101 is enlarged by the movable member 112, which moves upwardly, as shown by an arrow P, to conduct a dot-printing operation printing operation is finished, the movable member 112 and the first and second resilient members 113 and 114 return to their original positions.

We claim:

1. A laminated piezoelectric element comprising:
   a laminate of piezoelectric ceramic plates and inner electrodes, the piezoelectric ceramic plates being laminated alternately with the inner electrodes, the laminate having a peripheral surface presenting individual peripheral surfaces of the ceramic plates, the piezoelectric ceramic plates having recesses at the peripheral surfaces thereof;
   a positive outer electrode connected to a first group of said inner electrodes at the peripheral surface of the laminate;
   a negative outer electrode connected to another group of said inner electrodes at the peripheral surface of the laminate; and
   a coating of fine ceramic particles, having an average particle size of less than 3 μm in their largest dimension, coated directly on substantially the entire peripheral surfaces of the piezoelectric ceramic plates, the recesses having a size and the fine ceramic particles having an average particle size which is smaller than the size of the recesses, so that the fine ceramic particles fill the recesses on the peripheral surfaces of the piezoelectric ceramic plates to substantially prevent formation of a current between said inner electrodes even when water exists in the recesses.

2. A laminated piezoelectric element according to claim 1, wherein the coating of fine ceramic particles is applied to the peripheral surfaces of the piezoelectric ceramic plates by spraying with a volatile solvent.

3. A laminated piezoelectric element according to claim 1, wherein the coating of fine ceramic particles is coated on the peripheral surfaces of the piezoelectric ceramic plates together with a resin as a binder.

4. A laminated piezoelectric element according to claim 1, wherein the fine ceramic particles have an average particle size of less than 1 μm in their largest dimension.

5. A laminated piezoelectric element according to claim 1, wherein the fine ceramic particles are boron nitride.

6. A laminated piezoelectric element according to claim 1, for use as an actuator.

7. A laminated piezoelectric element according to claim 1, for use as an actuator of a printing head.

8. A laminated piezoelectric element according to claim 3, wherein the resin is an epoxy resin.

9. A laminated piezoelectric element comprising:
   a laminate of piezoelectric ceramic plates and inner electrodes, the piezoelectric ceramic plates being laminated alternately with the inner electrodes, the laminate having a peripheral surface presenting individual peripheral surfaces of the ceramic plates, the piezoelectric ceramic plates having recesses at the peripheral surfaces thereof;
   a positive outer electrode connected to a first group of said inner electrodes at the peripheral surface of the laminate;
   a negative outer electrode connected to another group of said inner electrodes at the peripheral surface of the laminate; and
   a ceramic layer including fine ceramic particles, having an average particle size less than 3 μm in their largest dimension, coated directly on the peripheral surfaces of the piezoelectric ceramic plates, the recesses having a size and the fine ceramic particles having an average particle size which is smaller than the size of the recesses.

10. A laminated piezoelectric element according to claim 9, wherein the ceramic layer is a sputtered layer.

11. A laminated piezoelectric element according to claim 9, for used as an actuator.

12. A laminated piezoelectric element according to claim 9, for used as an actuator of a printing head.

* * * * *

UNITED STATES PATENT AND TRADEMARK OFFICE
CERTIFICATE OF CORRECTION

PATENT NO. : 5,389,851
DATED : FEBRUARY 15, 1995
INVENTOR(S) : DAISUKE KIMURA ET AL.

It is certified that error appears in the above-indentified patent and that said Letters Patent is hereby corrected as shown below:

Col. 3,  line 29, "22" should be --21--;
         line 38, "alternative" should be --alternating--;
         line 42, "are connected" should be --are alternately connected--.

Col. 4,  line 53, "electrodistortion" should be --electro-distortion--;
         line 56, "also" should be deleted.

Col. 5,  line  8, "The" should be --One end of--;
         line 28, "operation printing" should be --operation. After each printing--.

Col. 6,  line 51, "used" should be --use--;
         line 53, "used" should be --use--.

Signed and Sealed this

Thirtieth Day of May, 1995

*Attest:*

BRUCE LEHMAN

*Attesting Officer*   *Commissioner of Patents and Trademarks*